United States Patent [19]
Takai et al.

[11] Patent Number: 5,402,748
[45] Date of Patent: Apr. 4, 1995

[54] METHOD OF GROWING A COMPOUND SEMICONDUCTOR FILM

[75] Inventors: Kazuaki Takai; Takashi Eshita, both of Kawasaki, Japan

[73] Assignee: Fujitsu Limited, Kanagawa, Japan

[21] Appl. No.: 44,029

[22] Filed: Apr. 8, 1993

[30] Foreign Application Priority Data

Apr. 9, 1992 [JP] Japan .................................. 4-088468

[51] Int. Cl.$^6$ .............................................. C30B 25/02
[52] U.S. Cl. ........................................ 117/84; 117/88; 117/89
[58] Field of Search ....... 156/600, 613, 614, DIG. 70; 117/84, 88, 89, 93, 937, 954, 955

[56] References Cited

U.S. PATENT DOCUMENTS

| | | | |
|---|---|---|---|
| 3,928,092 | 12/1975 | Ballamy et al. | 148/175 |
| 3,963,539 | 6/1976 | Kemlage et al. | 117/89 |
| 4,659,401 | 4/1987 | Reif et al. | 148/175 |
| 5,035,767 | 7/1991 | Nishizawa | 117/88 |

FOREIGN PATENT DOCUMENTS 58-95696  6/1983  Japan .
60-191096 9/1985  Japan .

Primary Examiner—R. Bruce Breneman
Assistant Examiner—Felisa Garrett
Attorney, Agent, or Firm—Armstrong, Westerman, Hattori, McLeland & Naughton

[57] ABSTRACT

A method of fabricating a semiconductor device comprises the steps of growing a first layer of a group III-V compound semiconductor material on a substrate by a vapor phase deposition process by setting the temperature at a first temperature, raising the temperature from the first temperature to a second, higher temperature, growing a second layer of a group III-V compound semiconductor material on the first layer, wherein the step of raising the temperature is conducted while supplying a source gas for the group V element under a condition, determined in terms of a total pressure and a partial pressure of the source gas, such that the condition falls within a region defined by a first condition wherein the total pressure is set to 76 Torr and the partial pressure is set to 0.35 Torr, a second condition wherein the total pressure is set to 760 Torr and the partial pressure is set to 0.6 Torr, a third condition wherein the total pressure is set to 760 Torr and the partial pressure is set to 5.7 Torr, and a fourth condition wherein the total pressure is set to 76 Torr and the partial pressure is set to 1.3 Torr.

7 Claims, 9 Drawing Sheets

FIG. I (A) PRIOR ART
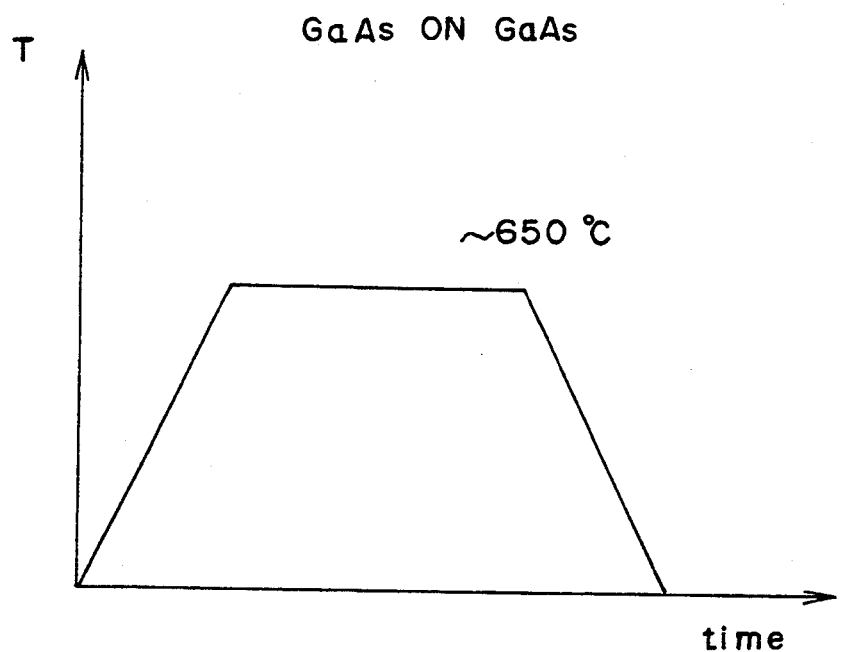
FIG. I (B) PRIOR ART
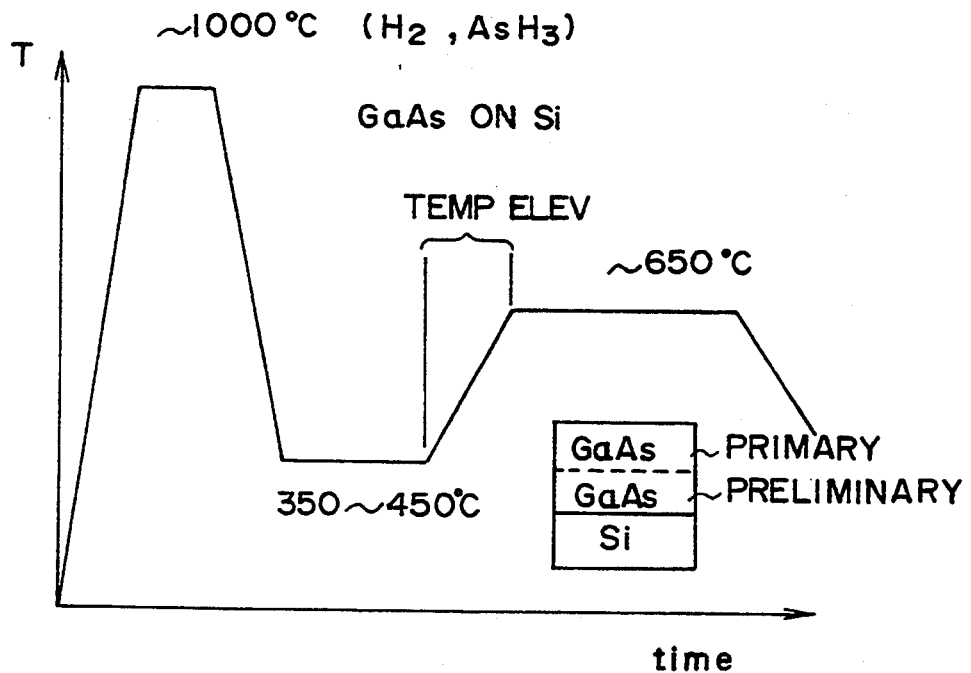

METHOD OF GROWING A COMPOUND SEMICONDUCTOR FILM

BACKGROUND OF THE INVENTION

The present invention generally relates to fabrication of semiconductor devices and more particularly to a process for growing a group III-V compound semiconductor layer on a Si substrate.

Gallium arsenide (GaAs) is a typical III-V compound semiconductor material used for laser diodes and various fast speed semiconductor devices such as metal-semiconductor field effect transistor (MESFET), high electron mobility transistor (HEMT), heterojunction bipolar transistor (HBT) and the like because of its characteristic band structure and high electron mobility. Such a semiconductor device is constructed on a GaAs wafer sliced from a GaAs ingot grown as a single crystal or on a GaAs substrate grown epitaxially on a surface of a Si wafer. In the latter construction, one can avoid the difficulty of handling heavy and brittle GaAs wafer during the fabrication process of the device by using a light and strong Si wafer fabricated by a well established process. Further, one can easily obtain a large diameter wafer in such a construction. As a result, one can handle the wafer easily and reduce the fabrication cost of the device. Further, such a wafer is suited for fabricating a so called optoelectronic integrated circuits (OEIC) wherein semiconductor optical devices such as GaAs laser diode are assembled together with Si or compound semiconductor transistors on a common semiconductor chip.

When growing GaAs on Si wafer epitaxially, however, one encounters various difficulties. Such difficulties are caused mainly due to the large difference in the lattice constant and thermal expansion between Si and GaAs. For example, the lattice constant of Si is smaller than that of GaAs by about 4% and the thermal expansion coefficient of Si is smaller than that of GaAs by about 230%. From simple calculation based upon the difference in the lattice constant, it is predicted that the GaAs substrate constructed as such contains dislocations with a density in the order of $10^{12}/cm^2$. Thus, a simple epitaxial growth of GaAs layer made directly on Si substrate is usually unsuccessful. Even if successful, such a semiconductor layer inevitably contains significant defects such that they cannot be used as the substrate for semiconductor devices.

In order to eliminate these problems and to obtain a GaAs substrate layer having a quality satisfactory for a substrate of semiconductor device, it is proposed to grow a preliminary layer of GaAs on the silicon substrate at a low temperature and deposit a primary layer of GaAs further on the preliminary layer at a higher temperature subsequently. Thereby, the primary layer serves for the substrate for carrying semiconductor devices thereon.

FIG. 1(A) shows a conventional process for growing a GaAs primary or device layer on a GaAs substrate that may be sliced from a GaAs single crystal ingot. There, the temperature of the substrate is elevated to about 650° C. and the GaAs primary layer is simply grown epitaxially thereon according to the well established MBE or MOCVD process. On the other hand, because of the difference in the thermal expansion and lattice constant described previously, such a simple epitaxial growth of the GaAs layer is not applicable to the case where a Si substrate is used.

In order to achieve an epitaxial growth of a GaAs layer on a Si substrate, a process shown in FIG. 1(B) is proposed (Akiyama, M. et al, J. Cryst. Growth 77, 490–497, 1986).

In the process of FIG. 1(B), the temperature of the Si substrate is elevated at first to about 1000° C. in the atmosphere containing $H_2$ and $AsH_3$ to remove any oxide film on the surface of the silicon substrate. Next, the temperature is decreased to 400°–500° C. and a preliminary layer of GaAs is grown on the surface of the silicon substrate. Typically, the preliminary layer is grown with a thickness of 5–20 nm. After the preliminary layer is thus grown, the temperature of the substrate is elevated to 600°–750° C. and a primary layer of GaAs is deposited on the preliminary layer with a desired thickness. During the process of deposition of the GaAs primary layer, the preliminary layer crystallizes while maintaining epitaxy to the silicon substrate. Thereby, the primary layer provided on the preliminary layer is grown also epitaxially.

In the foregoing process of FIG. 1(B), however, it has been discovered that the surface of the preliminary layer becomes rough or undulated upon elevating the temperature for the deposition of the primary layer, and the rough surface of the preliminary layer is transferred to the surface of the primary layer that is grown thereon.

FIG. 2 shows a relationship between the surface roughness of the preliminary layer and the surface roughness of the primary layer grown thereon, wherein the horizontal axis represents the surface roughness of the preliminary layer while the vertical axis represents the surface roughness of the primary layer. As can be seen from FIG. 2, the roughness of the primary layer increases generally linearly with the roughness of the preliminary layer.

It should be realized that such an irregularity in the GaAs primary layer causes a serious problem such as scattering of carriers, reduced carrier mobility, and the like, particularly in the devices such as HEMT that use the 2DEG formed at a heterojunction interface between two different semiconductor layers. The fabrication of the preliminary layer with various surface roughness values as shown in FIG. 2 will be described later with reference to the present invention.

SUMMARY OF THE INVENTION

Accordingly, it is a general object of the present invention to provide a novel and useful method of growing a compound semiconductor film on a silicon substrate, wherein the foregoing problems are eliminated.

Another object of the present invention is to provide a method of growing a layer of a compound semiconductor material on a substrate by a vapor phase deposition process, comprising the steps of:

growing a first layer of a group III-V compound semiconductor material on a substrate by setting the temperature of said substrate at a first temperature;

raising the temperature of said substrate from said first temperature to a second, higher temperature;

growing a second layer of a group III-V compound semiconductor material on said first layer at said second temperature;

said step of raising the temperature being conducted while supplying a source gas for said group V element under a condition, determined in terms of a total pressure and a partial pressure of said source gas, such that said condition falls within a region defined by a first condition wherein the total pressure is set to 76 Torr and the partial pressure is set to 0.35 Torr, a second condition wherein the total pressure is set to 760 Torr and the partial pressure is set to 0.6 Torr, a third condition wherein the total pressure is set to 760 Torr and the partial pressure is set to 5.7 Torr, and a fourth condition wherein the total pressure is set to 76 Torr and the partial pressure is set to 1.3 Torr.

According to the present invention, one can minimize the roughness in the surface of the first layer during the process of growing the second layer, by setting the condition of deposition to fall in the range defined by the first through fourth conditions. Thereby, one can improve the quality of the semiconductor layer to such a degree that a high performance semiconductor device such as HEMT can be constructed thereon successfully.

Other objects and further features of the present invention will become apparent from the following detailed description when read in conjunction with the attached drawings.

BRIEF DESCRIPTION OF THE DRAWINGS

FIGS. 1(A) and i(B) are diagrams showing the temperature profile for the process of growing a GaAs layer used for carrying a semiconductor device on a substrate, wherein FIG. 1(A) shows the case for growing the GaAs layer on a GaAs substrate while FIG. 1(B) shows the case for growing the GaAs layer on a Si substrate;

DETAILED DESCRIPTION OF PREFERRED EMBODIMENTS

Figure 3:
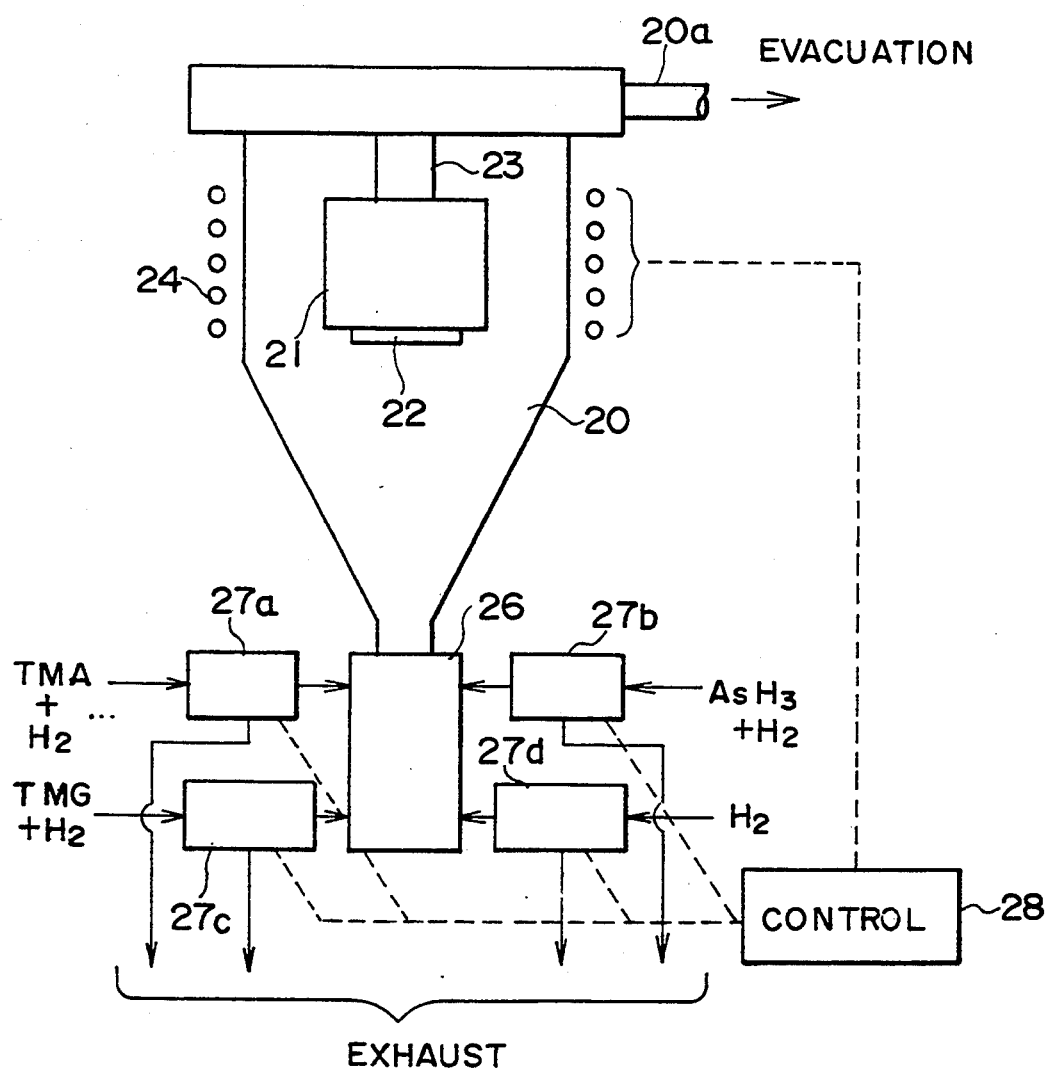
FIG. 3 is a diagram showing a deposition apparatus used in the present invention.

FIG. 3 shows an apparatus used in the present invention for growing a group III-V compound semiconductor layer on a surface of a Si substrate via an intervening buffer layer by a metal-organic chemical vapor deposition (MOCVD) process. In the embodiment described below, GaAs is chosen as the group III-V compound semiconductor material.

Referring to the drawing, the apparatus has a chimney type reaction chamber 20 evacuated through a port 20a at its top, a susceptor 21 for heating a Si substrate 22 held therein in response to radio frequency excitation, a support pipe 23 for supporting the susceptor 21, an excitation coil 25 for generating the radio frequency excitation, a gas mixer 26 for introducing a gas or a gas mixture into the reaction chamber 20, and gas supply valves 27a–27d for introducing various source gases into the reaction chamber 20 under control of a controller 28.

Next, the experiment that has been conducted by the inventor of the present invention and forms the basis of present invention will be described.

In the experiment, a GaAs layer is grown directly on a silicon substrate at a low temperature of 350°–400° C. and the temperature is elevated to about 650° C. as practiced in the art while changing the AsH$_3$ partial pressure variously during the process of raising the temperature. Further, the surface roughness of the GaAs layer thus obtained is examined for each of the samples thus obtained.

More specifically, the experiment has been conducted by baking the Si substrate 22 in the reaction chamber 20 at 1000° C. for 10 minutes while flowing H$_2$ and AsH$_3$ under a total pressure of 76 Torr. There, H$_2$ is supplied with a flowrate of 12 slm and AsH$_3$ is supplied with a flowrate of 34 sccm. Thereby, the native oxide film formed on the surface of the Si substrate 22 is removed as a result of reduction caused by H$_2$. By incorporating As vapor in the form of AsH$_3$ into the reaction vessel during this process, evaporation of As from GaAs, which may cover the inner wall of the reaction vessel wall 20, is effectively eliminated. Thereby, the reaction of forming free Ga from GaAs as a result of evaporation of As is suppressed, and any contamination of the surface of the Si substrate 22 by Ga droplets that are formed from the GaAs on the chamber wall is effectively eliminated. In the subsequent processes, the supply of H$_2$ has been continued with the constant flowrate of 12 slm throughout the experiment.

After removal of the oxide layer from the surface of the Si substrate, the temperature of the substrate is reduced to about 350°–450° C. for growth of the preliminary layer as is commonly practiced in the art. There, the flowrate of AsH$_3$ is set to 0.07–0.27 slm, and TMG (trimethylgallium) is supplied with a flowrate of about 9–18 sccm to grow a GaAs layer with a thickness of 5–20 nm. The total pressure is held at 76 Torr.

Next, the temperature of the substrate 22 is raised to about 650° C. In this process of temperature elevation, the supply of TMG is interrupted, while the supply of AsH$_3$ is continued in order to avoid evaporation of As from the deposited GaAs layer or from the GaAs deposit on the chamber wall. Conventionally, the flowrate of AsH$_3$ is set during this process to about 17 sccm that corresponds to an AsH$_3$ partial pressure of 0.1 Torr that is sufficient for eliminating the evaporation of As.

Figure 4:
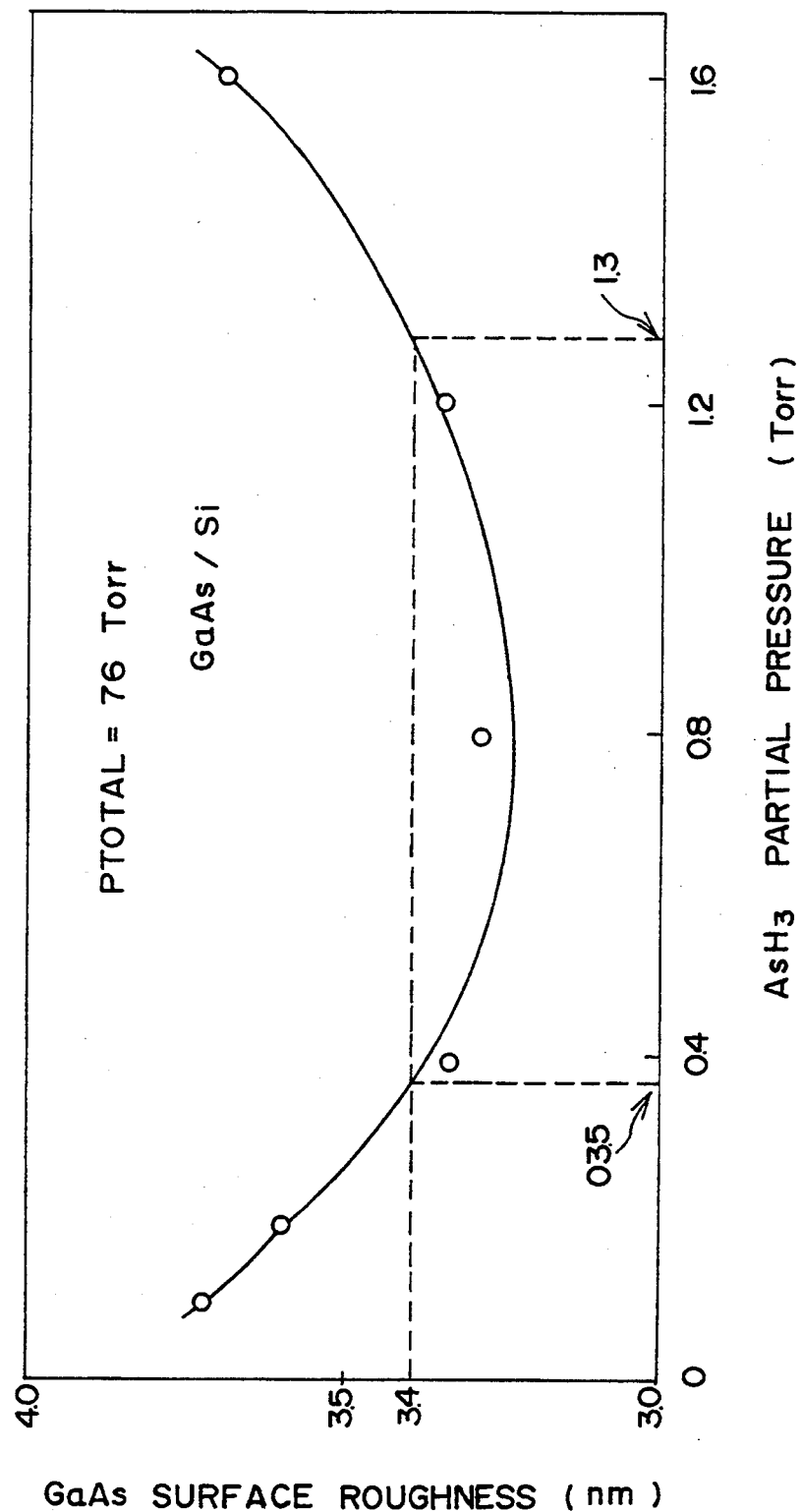
FIG. 4 is a diagram showing the 76 Torr-isobaric relationship between the surface roughness of the preliminary layer and the AsH$_3$ partial pressure during the temperature elevation step.
Figure 9:
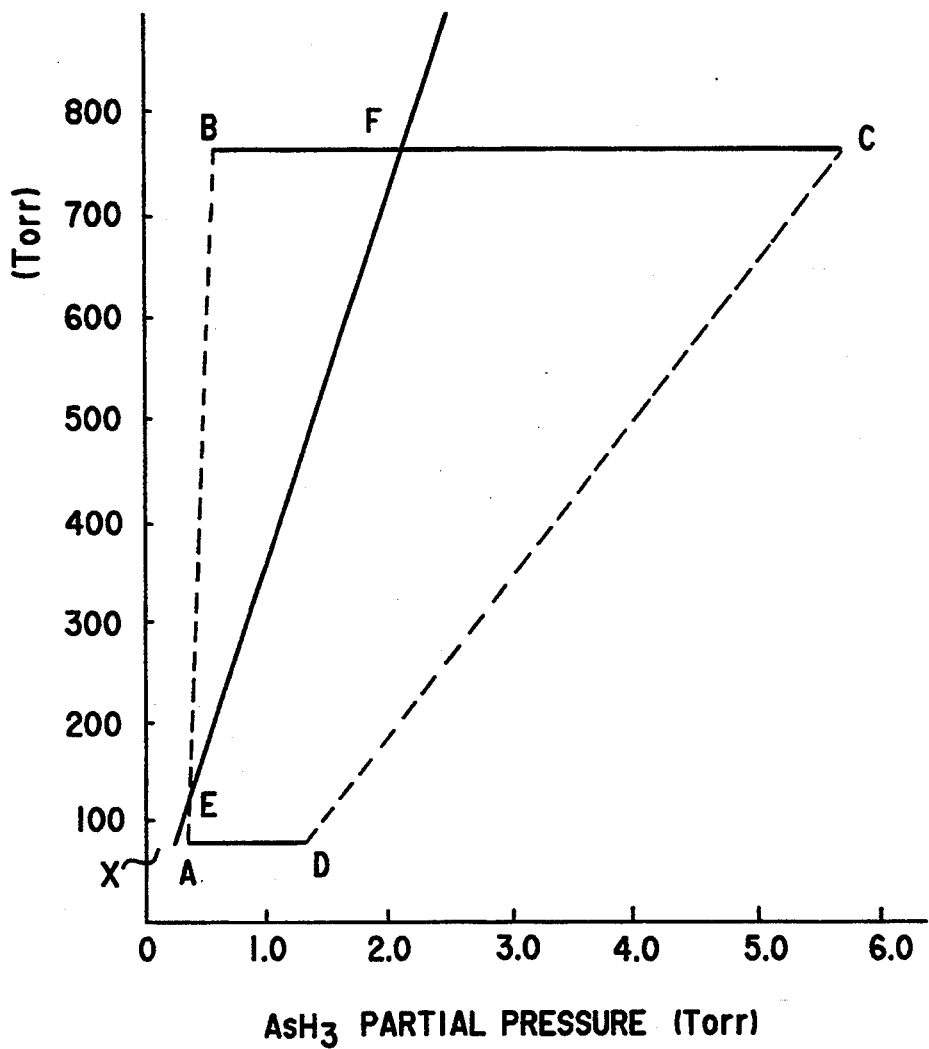
FIG. 9 is a diagram showing an optimum range of combination of the total pressure inside the reaction vessel and the AsH$_3$ partial pressure during the temperature elevation process.

In the present experiment, the effect of the AsH$_3$ partial pressure exceeding the foregoing conventional level on the roughening of the surface of the preliminary layer has been explored. More specifically, the process of temperature elevation is conducted while using various flowrates of AsH$_3$ in the range from 17 sccm to 270 sccm, under the total pressure of 76 Torr. There, it has been discovered that the roughness of the surface of the GaAs preliminary layer after the foregoing process of temperature elevation, varies depending on the flowrate and hence the partial pressure of AsH$_3$ that has been used as shown in FIG. 4, wherein the horizontal axis represents the partial pressure of AsH$_3$ while the vertical axis represents the roughness-mean-square (rms) value for the surface of the GaAs layer after the temperature elevation process. The measurement of the roughness is conducted by an atomic force microscope. It will be noted from FIG. 4 that there is a minimum in the roughness in correspondence to the AsH$_3$ partial pressure of about 0.8 Torr. FIG. 4 corresponds to the isobaric tie-line AD shown in FIG. 9, wherein FIG. 9 shows the combination of the total pressure and the AsH$_3$ partial pressure. FIG. 9 will be described later.

Figure 5:
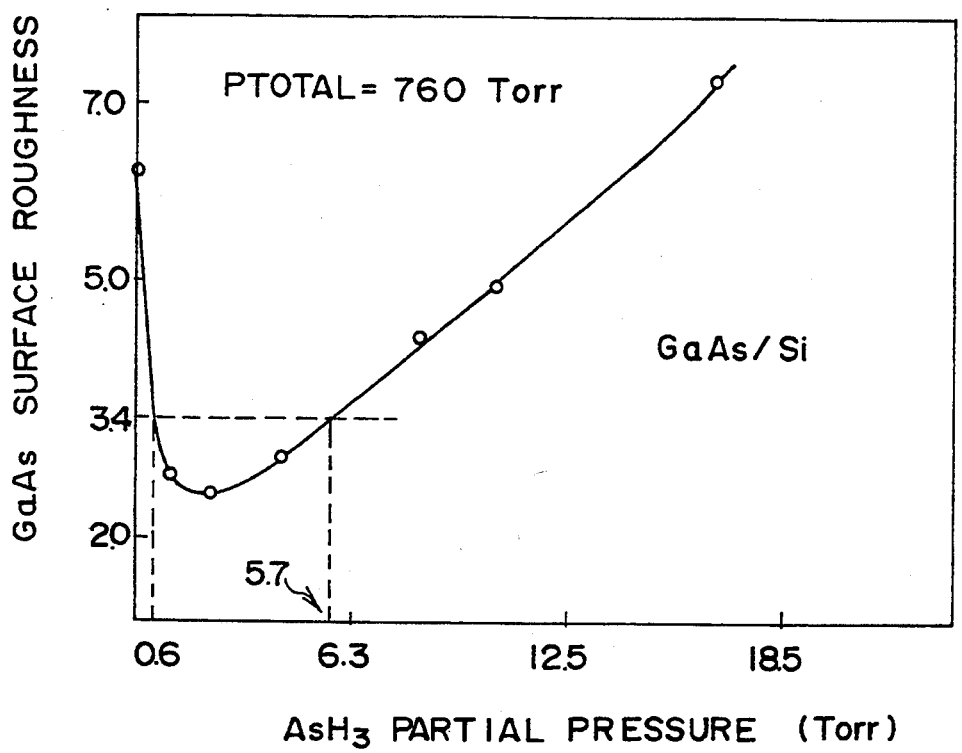
FIG. 5 is a diagram showing the 760 Torr-isobaric relationship between the surface roughness of the preliminary layer and the AsH$_3$ partial pressure during the temperature elevation step.

FIG. 5 shows a similar relationship between the surface roughness and the AsH$_3$ partial pressure for the GaAs layer conducted at 760 Torr. In the present experiment, too, the GaAs layer is grown directly on the Si substrate baked at 1000° C. and cooled subsequently to about 350°–450° C., wherein the surface roughness is detected by the atomic force microscope after raising the temperature to about 650° C. The condition of baking as well as the condition for deposition of the GaAs layer are set identical to those of the previous experiment, while the total pressure is set to 760 Torr only when elevating the temperature as described above. In the present experiment, it will be seen that there appears a minimum in the surface roughness at the AsH$_3$ partial pressure of about 2 Torr as indicated in FIG. 5. The relationship of FIG. 5 corresponds to an isobaric tie-line BC of FIG. 9.

Figure 6:
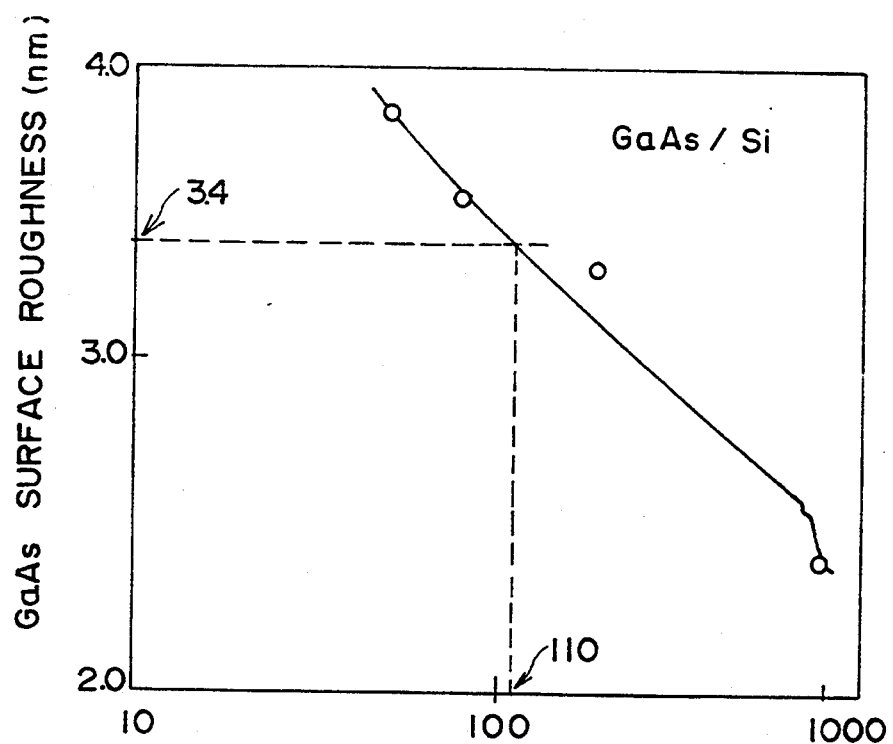
FIG. 6 is a diagram showing the relationship between the surface roughness of the preliminary layer and the total pressure during the temperature elevation step conducted while flowing AsH$_3$ at a constant flowrate of 34 sccm.

Further, FIG. 6 shows a relationship between the surface roughness of the GaAs layer grown on the Si substrate and the total pressure during the temperature elevation process. Again, the GaAs layer is grown on the baked Si substrate under the deposition condition identical to the previous experiments while changing the total pressure variously. The flowrate of AsH$_3$ is held constant at 34 sccm.

In the present experiment, the temperature is elevated, after deposition of the GaAs layer, to about 650° C. while using various combinations of the total pressure and the AsH$_3$ partial pressure located on a tie-line E-F defined in FIG. 9. There, it will be noted that the surface roughness of the GaAs layer after the foregoing temperature elevation process decreases when the total pressure during the temperature elevation process is set smaller.

The foregoing experiments shown in FIGS. 4–6 indicate that one can improve the surface roughness of the GaAs preliminary layer when fabricating a composite semiconductor substrate having the GaAs-on-Si structure. Further, it has been discovered that the surface roughness of the GaAs primary layer is improved proportionally to the improvement in the surface roughness of the preliminary layer as already mentioned in FIG. 2.

More specifically, experiments have been conducted by growing a GaAs preliminary layer and a GaAs primary layer consecutively on a Si substrate, wherein the surface roughness is measured for each of the GaAs preliminary layer and the GaAs primary layer. The experiment is started with the step of baking the Si substrate at 1000° C. according to the condition described already, and the GaAs preliminary layer is grown on the Si substrate thus processed at a temperature of 350°–450° C. There, the preliminary layer is grown with a thickness of 5–20 nm while flowing AsH$_3$ and TMG respectively with flowrates of 0.07–0.27 slm and 9–18 sccm.

Next, the temperature of the substrate is raised to about 650° C. During this temperature elevation process, various combinations of the total pressure and AsH$_3$ partial pressure are employed as listed in TABLE I below.

TABLE I

| SAMPLE 1 | TOTAL PRESSURE (Torr) | AsH$_3$ partial pressure (Torr) |
|---|---|---|
| 1 | 76 | 0.1 |
| 2 | 76 | 0.2 |
| 3 | 760 | 2.0 |
| 4 | 760 | 20.0 |

Further, in each of the samples 1–4, the GaAs primary layer is deposited on the preliminary layer while holding the temperature at the foregoing temperature of 650° C. There, AsH$_3$ and TMG are supplied with flowrates of 68 sccm and 2.5 sccm, respectively, to form the GaAs primary layer with a thickness of about 3 μm. It should be noted that the relationship of FIG. 2 represents the relationship between the surface roughness of the preliminary layer and the primary layer thus formed for each of the samples 1–4.

Figure 2:
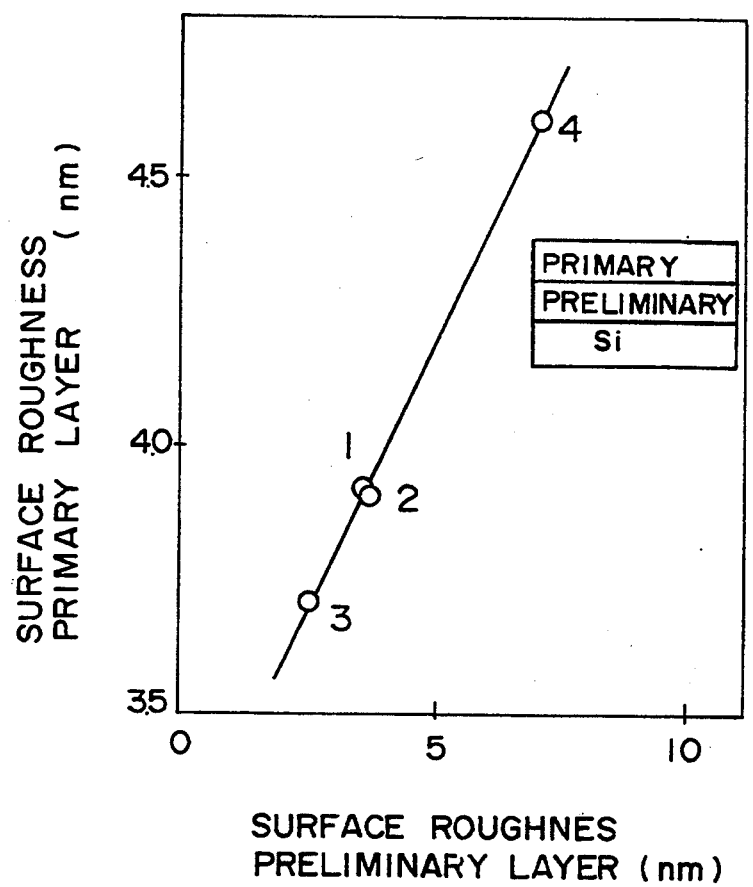
FIG. 2 is a diagram showing the relationship between the surface roughness of a preliminary layer of GaAs grown directly on a Si substrate and the surface roughness of a primary layer of GaAs grown further on the preliminary layer in the process of FIG. 1(B)

In view of the relationship of FIG. 2, an attempt is made to determine the optimum range of condition for elevating the temperature of the preliminary layer, by fabricating the actual device of HEMT.

Figure 7:
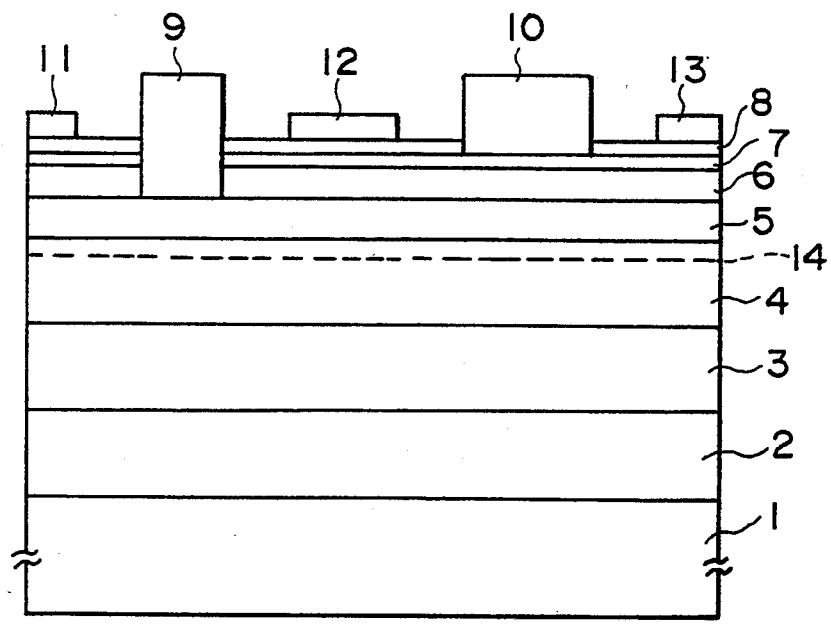
FIG. 7 is a diagram showing the structure of a HEMT fabricated according to the process of the present invention.

Hereinafter, an embodiment of the present invention as applied to the fabrication of a HEMT will be described with reference to FIG. 7 showing the device structure.

Referring to the structure of FIG. 7, the device is constructed on a Si substrate 1 on which an undoped GaAs buffer layer 2 is provided. Further, an undoped GaAlAs insulation layer 3 is provided on the buffer layer 2 with a thickness of 3 μm for device isolation, and an active layer 4 of undoped GaAs is provided on the GaAlAs insulation layer 3 with a thickness of 200 nm. Further, an n-type GaAlAs layer 5 is provided on the active layer 4 with a thickness of 50 nm to form a heterojunction interface between the layer 4 and the layer 5. Thereby, the n-type GaAlAs layer 5 supplies electrons to the GaAs active layer 4 and a 2DEG (two-dimensional electron gas) is formed in the active layer 4 along the upper major surface that forms the foregoing heterojunction interface.

On the layer 5, an n-type GaAs layer 6 is provided with a thickness of 5 nm and an n-type AlGaAs layer 7 is provided further on the layer 6 with a thickness of 5 nm. Further, the surface of the layer 7 is covered by an n-type GaAs layer 8.

On the layer 8, ohmic electrodes 11, 12 and 13 are provided respectively in correspondence to the source and drain of the HEMT, wherein the electrode 12 is used as the source and simultaneously as the drain by two adjacent devices. There, the first device has a Schottky electrode 9 between the ohmic electrodes 11 and 12 as a gate, wherein the electrode 9 reaches the n-type GaAlAs layer 5 via a recess structure provided in the layers 6–8 to expose the layer 5. Thereby, the 2DEG is vanished in correspondence to the region located under the gate electrode 9 in the unbiased state, and the device having the gate 9 acts as the enhanced-mode HEMT. On the other hand, another Schottky gate electrode 10 is provided between the ohmic electrodes 12 and 13 to establish a contact with the layer 7. Thereby, the Schottky electrode 10 acts as the gate electrode of the depletion mode HEMT.

In the device of FIG. 7, the GaAs buffer layer 2 is formed according to the two-step growth process described previously for growing the preliminary layer and the primary layer consecutively with respective thicknesses of 10 nm and 3 $\mu$m, wherein the combination of the total pressure and the AsH$_3$ partial pressure is changed variously during the temperature elevation process for evaluating the performance of the device in relation to the surface roughness of the layer 2.

Figure 8:
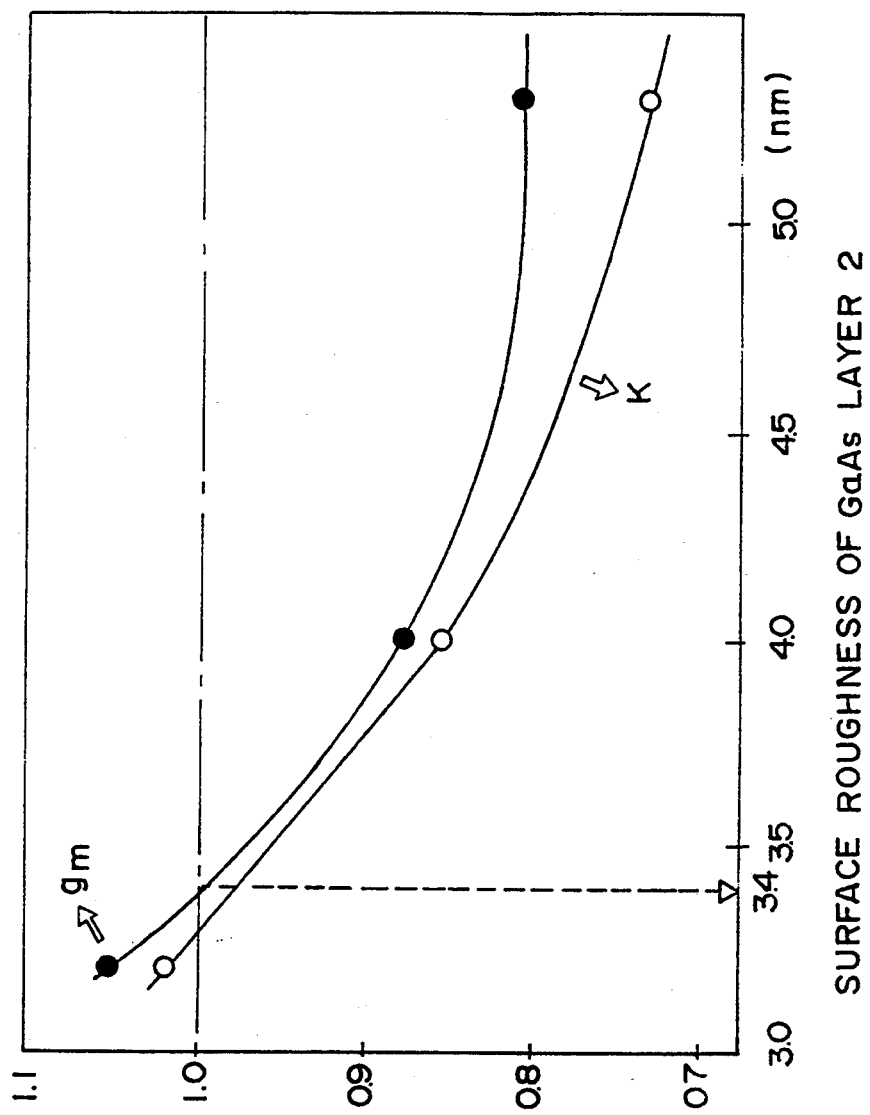
FIG. 8 is a diagram showing the relationship between the performance and the surface roughness of the HEMT fabricated according to the process of the present invention in comparison with a HEMT fabricated on a bulk GaAs substrate.

FIG. 8 shows the result of measurement of the transconductance $g_m$ and the K-factor for the fabricated HEMTs, as a function of the surface roughness of the preliminary layer in the GaAs buffer layer 2. There, the transconductance and the K-factor are represented in terms of the ratio with respect to the corresponding parameters of the device that is constructed on a substrate of a GaAs bulk crystal. There, it will be noted that both the transconductance and the K-factor become comparable to one (1), when the surface roughness of the preliminary layer has been decreased below about 3.4 nm. In other words, when the condition for elevating the temperature of the substrate is selected appropriately, one can achieve the performance of HEMT comparable to the performance of the device provided on the substrate of bulk GaAs crystal.

FIG. 9 shows the area wherein the foregoing condition that the roughness of the GaAs preliminary layer becomes equal to or smaller than the foregoing critical value of 3.4 nm. There, the variation of the surface roughness along the tie-line AD has been described already with reference to FIG. 4, while the variation of the surface roughness along the tie-line BC has been described with reference to FIG. 5. Further, the variation in the surface roughness along the tie-line E-F has been described already with reference to FIG. 6.

It will be noted from FIG. 6 that the surface roughness would be improved when the total pressure of the reaction chamber has been increased above the value of 760 Torr. On the other hand, when the pressure has exceeded the foregoing level, the reaction vessel becomes to be a pressurized state that is not preferable from the view point of safety, particularly in view of the toxicity of AsH$_3$. FIG. 6 shows that the preferable surface roughness is obtained by increasing the total pressure above about 110 Torr.

Thus, the preferable operational condition for elevating the temperature of the preliminary layer falls in the range defined by the parallelogram ABCD, wherein the point A is represented by the combination of 76 Torr for the total pressure and 0.35 Torr for the partial pressure of AsH$_3$, the point B is represented by the combination of 760 Torr for the total pressure and 0.6 Torr for the partial pressure of AsH$_3$, the point C is represented by the combination of 760 Torr for the total pressure and 5.7 Torr for the partial pressure of AsH$_3$, and the point D is represented by the combination of 76 Torr for the total pressure and 1.3 Torr for the partial pressure of AsH$_3$. On the other hand, conventional process has generally employed the condition represented as "X" in FIG. 9 wherein the total pressure is set to about 76 Torr and the AsH$_3$ partial pressure set to about 0.1 Torr. It should be noted that the point X of FIG. 9 corresponds to the condition for the sample 1 shown in TABLE I.

Figure 10:
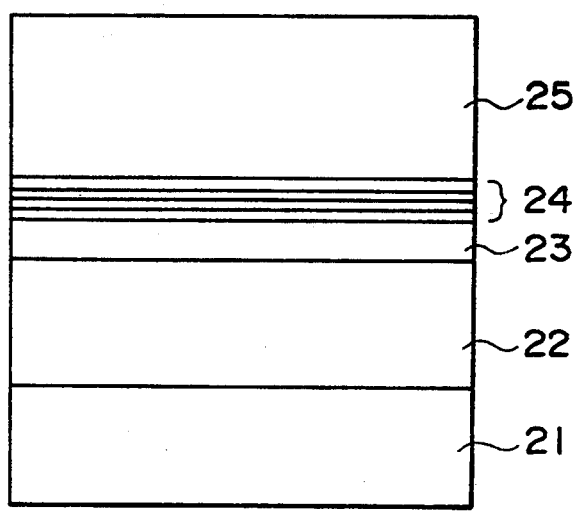
FIG. 10 is a diagram showing the structure of another semiconductor device that is fabricated according to the process of the present invention.

FIG. 10 shows another embodiment of the present invention, wherein the process of elevating the substrate temperature under the controlled condition of the present invention is applied to a semiconductor device that uses a superlattice structure.

Referring to FIG. 10, the device is constructed on a Si substrate 21 on which a GaAs buffer layer 22 is provided epitaxially, wherein an InGaAs layer 23 is grown further on the GaAs buffer layer 22 epitaxially, and a superlattice layer 24 of InGaAs and GaAs is provided on the InGaAs layer 23. On the layer 24, a GaAs layer 25 is provided. The structure of FIG. 10 may be used for a laser diode wherein the superlattice layer 24 acts as the active layer. There, the substrate 21 as well as the layers 22 and 23 are doped to the n-type while the layer 25 is doped to the p-type, or vice versa. In such an application of laser diode, it is also essential that the interface between the InGaAs layer and the GaAs layer forming the superlattice layer 24 has minimum irregularity. This in turn poses a requirement to grow the InGaAs layer 23 to have a substantially flat upper major surface.

In order to achieve this, the present invention uses the two-step growth process for the GaAs buffer layer 22, in combination with the controlled temperature elevation process described before. Thus, the layer 22 is formed by depositing a preliminary GaAs layer directly on the Si substrate 21 at about 350°–450° C., while supplying TMG and AsH$_3$ together with H$_2$. The flowrate for TMG and AsH$_3$ may be set as described previously. After the supply of TMG is interrupted, the temperature is elevated to about 650° C. while controlling the total pressure and the partial pressure of AsH$_3$ to fall in the range ABCD shown in FIG. 9. Further, the primary layer of GaAs is grown on the preliminary layer thus processed to form the buffer layer 22 that has a substantially flat upper major surface.

By growing the InGaAs layer 23 on the GaAs buffer layer 22 thus formed, one can guarantee a satisfactory flatness in the upper major surface of the layer 23, and the InGaAs/GaAs superlattice layer 24 can be formed on the layer 23 to form a semiconductor structure that is suitable for the formation of the efficient laser diode or other optical semiconductor devices. As the conditions for the deposition of the layer 23 as well as the superlattice layer 25 and the GaAs layer 25 are well known, further description thereof will be omitted.

Although the present invention has been described heretofore for the embodiments wherein GaAs is used for the group III-V compound semiconductor device, the present invention is by no means limited to a particular compound but is applicable also to the system wherein the preliminary layer and the primary layer are formed of GaAs, AlAs, InAs, GaP, AlP, InP and a mixed crystal thereof.

Further, the present invention is not limited to the embodiments described heretofore, but various variations and modifications may be made without departing from the scope of the invention.

What is claimed is:

1. A method of fabricating a semiconductor device, comprising the steps of:
    growing a first layer of a group III-V compound semiconductor material on a substrate by a vapor phase deposition process by setting the temperature of said substrate at a first temperature;
    raising the temperature of said substrate from said first temperature to a second, higher temperature;
    growing a second layer of a group III-V compound semiconductor material on said first layer at said second temperature;
    said step of raising the temperature being conducted while supplying a source gas for a group V element under a condition, determined in terms of a total pressure and a partial pressure of said source gas, such that said condition falls within a region defined by a first condition wherein the total pressure is set to 76 Torr and the partial pressure is set to 0.35 Torr, a second condition wherein the total pressure is set to 760 Torr and the partial pressure is set to 0.6 Torr, a third condition wherein the total pressure is set to 760 Torr and the partial pressure is set to 5.7 Torr, and a fourth condition wherein the total pressure is set to 76 Torr and the partial pressure is set to 1.3 Torr.

2. A method as claimed in claim 1, wherein said step of growing said first layer and said step of growing said second layer are achieved by a metal organic vapor phase deposition process.

3. A method as claimed in claim 2, wherein said vapor phase deposition process uses $AsH_3$ as the source gas for the group V element.

4. A method as claimed in claim 2, wherein said first and second layers contain said group V element commonly.

5. A method as claimed in claim 1, wherein said substrate essentially consist of Si.

6. A method as claimed in claim 1, wherein said first and second layer comprises a group III-V compound semiconductor material selected from GaAs, AlAs, InAs, GaP, AlP, InP and a mixture thereof.

7. A method as claimed in claim 1, further comprising the steps of: providing a semiconductor device layer on said second layer; and forming a semiconductor layer on said semiconductor device layer.

* * * * *